United States Patent
Hu et al.

(10) Patent No.: US 6,436,820 B1
(45) Date of Patent: Aug. 20, 2002

(54) METHOD FOR THE CVD DEPOSITION OF A LOW RESIDUAL HALOGEN CONTENT MULTI-LAYERED TITANIUM NITRIDE FILM HAVING A COMBINED THICKNESS GREATER THAN 1000 Å

(75) Inventors: Jianhua Hu, Sunnyvale; Yin Lin, Mountain View; Fufa Chen, Cupertino; Yehuda Demayo, San Jose; Ming Xi, Sunnyvale, all of CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/497,787

(22) Filed: Feb. 3, 2000

(51) Int. Cl.[7] ............................................. H01L 21/324
(52) U.S. Cl. ...................... 438/656; 438/663; 438/680; 438/685; 427/255.391
(58) Field of Search ................... 427/255.391; 438/680, 438/685, 656, 660, 592, 663

(56) References Cited

U.S. PATENT DOCUMENTS

| | | |
|---|---|---|
| 4,570,328 A | 2/1986 | Price et al. .................... 29/571 |
| 4,605,947 A | 8/1986 | Price et al. ............... 357/23.15 |
| 4,847,157 A | 7/1989 | Goodman et al. ........... 428/426 |
| 4,946,712 A | 8/1990 | Goodman et al. ........... 427/166 |
| 5,271,963 A | 12/1993 | Eichman et al. ......... 427/248.1 |
| 5,279,857 A | 1/1994 | Eichman et al. ............. 427/255 |
| 5,308,655 A | 5/1994 | Eichman et al. ......... 427/248.1 |

(List continued on next page.)

FOREIGN PATENT DOCUMENTS

| | | | |
|---|---|---|---|
| DE | 4012901 A1 | 12/1990 | ............ C23C/16/34 |
| EP | 0 899 359 A1 | 3/1999 | ........... C23C/16/34 |
| JP | 8-279558 A | * 10/1996 | |
| JP | 10237662 | 9/1998 | ........... C23C/16/50 |
| JP | 11-74458 | 3/1999 | ........... H01L/27/04 |
| WO | WO 97/05298 | 2/1997 | ........... C23C/16/34 |
| WO | WO 98/33950 | 8/1998 | ........... C23C/16/02 |
| WO | WO 9936955 | 7/1999 | ....... H01L/21/3205 |

OTHER PUBLICATIONS

K. Ohto et al., "A Novel TiN/Ti Contact Plug Technology for Gigabit Scale DRAM Using T–PECVD and TiN–LPCVD," IEEE 1996 International Electronic Devices Meeting, pp. 361–364 (1996).*

(List continued on next page.)

*Primary Examiner*—Keith Christianson
*Assistant Examiner*—Stephen W. Smoot
(74) *Attorney, Agent, or Firm*—Shirley L. Church; Kathi Bean

(57) ABSTRACT

The present disclosure pertains to the discovery that TiN films having a thickness of greater than about 400 Å and, particularly greater than 1000 Å, and a resistivity of less than about 175 $\mu\Omega$cm, can be produced by a CVD technique in which a series of TiN layers are deposited to form a desired TiN film thickness. Each layer is deposited employing a CVD deposition/treatment step. During a treatment step, residual halogen (typically chlorine) was removed from the CVD deposited film. Specifically, a TiN film having a thickness of greater than about 400 Å was prepared by a multi deposition/treatment step process where individual TiN layers having a thickness of less than 400 Å were produced in series to provide a finished TiN layer having a combined desired thickness. Each individual TiN layer was CVD deposited and then treated by exposing the TiN surface to ammonia in an annealing step carried out in an ammonia ambient. The TiN film formed in this manner not only had a resistivity of less than about 175 $\mu\Omega$cm, but was substantially free of micro cracks as well, including films having a thickness greater than 1,000 Å.

26 Claims, 3 Drawing Sheets

U.S. PATENT DOCUMENTS

| | | | | |
|---|---|---|---|---|
| 5,416,045 A | * | 5/1995 | Kauffman et al. | 437/174 |
| 5,593,511 A | | 1/1997 | Foster et al. | 148/238 |
| 5,610,106 A | | 3/1997 | Foster et al. | 437/245 |
| 5,972,179 A | | 10/1999 | Chittipeddi et al. | 204/192.17 |
| 5,975,912 A | * | 11/1999 | Hillman et al. | |
| 5,990,021 A | * | 11/1999 | Prall et al. | |
| 6,010,940 A | | 1/2000 | Lee et al. | 438/396 |
| 6,040,021 A | | 3/2000 | Miyamoto | 427/576 |
| 6,060,389 A | * | 5/2000 | Brennan et al. | |
| 6,171,717 B1 | * | 1/2001 | Chang et al. | |
| 6,207,557 B1 | * | 3/2001 | Lee et al. | |
| 6,225,213 B1 | * | 5/2001 | Urabe | |

OTHER PUBLICATIONS

Translation of Japanese Published Patent Application 8–279558 A, Kenshi Kaizuka and Hiroshi Shinriki, "Semiconductor Device Manufacturing Method," Japanese Patent Office, Oct. 1996.*

J. Hu et al., "Electrical properties of Ti/TiN films prepared by chemical vapor deposition and their applications in submicron structures as contact and barrier materials", *Thin Solid Films*, 308–309, pp. 589–593 (1997).

A. Sherman et al., "Step Coverage of Thick, Low Temperature, LPCVD Titanium Nitride Films", 1046b Extended Abstracts, Fall Meeting, Seattle, WA, pp. 826–827 (Oct. 1990).

* cited by examiner

US 6,436,820 B1

METHOD FOR THE CVD DEPOSITION OF A LOW RESIDUAL HALOGEN CONTENT MULTI-LAYERED TITANIUM NITRIDE FILM HAVING A COMBINED THICKNESS GREATER THAN 1000 Å

BACKGROUND OF THE INVENTION

1. Field of the Invention

The present invention relates to a method and apparatus for producing thick titanium nitride film for plug-fill type applications. More specifically, the present invention relates to a method for producing TiN depositions having a thickness of about 400 Å or more (and typically 1000 Å or more), where the deposited material maintains low resistivity, low stress, and low chlorine content.

2. Brief Description of Background Art

Titanium nitride layers have been used in semiconductor device structures as barrier layers for preventing the inter-diffusion of adjacent layers of materials such as aluminum and silicon, for example. However, the resistivity of a conventional titanium nitride film is frequently greater than 150 $\mu\Omega$cm, which detracts from the overall conductivity of the layered conductive structure to which it contributes. Further, high residual film stress can cause a titanium nitride film to peel off from the surface of an underlying layer (typically silicon oxide, titanium, or titanium silicide). In the alternative, if the film does not peel off, the film stress can cause feature distortion on the substrate (typically a silicon wafer) surface or even deformation of a thin wafer.

U.S. Pat. No. 5,610,106 to Foster et al., issued on Mar. 11, 1997 and assigned to Sony Corporation, describes TiN films as typically being deposited over a substrate by reactively sputtering titanium in a nitrogen-argon mixture, or by evaporating titanium in a nitrogen atmosphere. The disclosure adds that sputtered films provide poor conformity while chemical vapor deposited films require the use of high temperatures which make the process impractical for use in multi-level metalization schemes. Foster suggests a plasma enhanced CVD process to overcome these deficiencies. The method disclosed by Foster et al. is for the deposition of films having a thickness ranging from about 200 Å to about 500 Å, and the deposition is carried out at a temperature of about 400 ° C. to about 500 ° C. and a process chamber pressure of about 5 Torr.

U.S. Pat. Nos. 5,279,857 and 5,308,655 to Eichman et al., issued on Jan. 18, 1994 and May 3, 1994, respectively, describe a method for reducing the chlorine content of TiN films by first forming a TiN film on a wafer, and then reacting the residual chlorine in the film with ammonia at a temperature of 600–700° C. and pressure of 115–300 mTorr to remove the residual chlorine. The theory presented is that low pressure chemical vapor deposition titanium nitride films deposited from TiCl$_4$ and NH$_3$ gas incorporates a large amount of chlorine in the film. This chlorine is said to be found to be concentrated at the grain boundaries and film interfaces. The Eichman et al. patents refer to "thin films" of titanium nitride, but are silent as to the thickness of such a film.

U.S. Pat. No. 4,570,328 to Price et al., issued on Feb. 18, 1986 describes a method of producing titanium nitride MOS device gate electrodes. In particular, the gate electrode and interconnect are fabricated from low pressure chemical vapor deposited titanium nitride. The film thicknesses described are between about 100 nm and 200 nm (1,000 Å and 2,000 Å). The films are deposited from a feed gas of titanium tetrachloride, ammonia and hydrogen, at temperatures between about 680° C. and 800° C. and at a pressure ranging between 100 mTorr and 300 mTorr. The films are subsequently annealed in a nitrogen atmosphere at a temperature between 900° C. and 1,000° C., to reduce resistivity. Price et al. explains that at film formation temperatures greater than approximately 800° C., severe gas phase depletion occurs resulting in a loss of control of the film thickness' uniformity. At temperatures less than approximately 680° C., TiNCl$_x$ is grown instead of the desired TiN, and annealing of the film causes 'cracks' and 'blisters' that form when chlorine atoms escape the film.

As indicated by the references cited above, there is a need for a method for removing halogen-comprising (typically chlorine-comprising) residues from TiN films deposited using CVD. The residual halogen content increases resistivity and can cause damage to the film structure during subsequent processing at elevated temperatures. There is a particular need for a method of removing halogen-comprising residues from a thick TiN film, where the method has minimal effect on the final film structure while providing a film having a low resistivity, preferably less than about 175 $\mu\Omega$cm.

SUMMARY OF THE INVENTION

In accordance with the present invention, a method is provided for producing a substantially uniform TiN film of a thickness of 400 Å or higher, preferably 1,000 Å or higher, where the resistivity of the deposited film is less than about 175 $\mu\Omega$cm. The method comprises forming a layer of TiN having a thickness of 400 Å or less by chemical vapor deposition using a halogen-comprising precursor and a nitrogen-comprising precursor; a halogen residue removal step which includes annealing the layer of TiN film in the presence of at least one gas which reacts with the halogen to produce a reaction product which is volatile under the precessing conditions; and, repeating the film forming and halogen residue removal steps multiple times, to form a multi-layer TiN film having the desired thickness. Preferably the halogen residue removal step is carried out in the chemical vapor deposition chamber used for deposition of the TiN film, so that a series of TiN deposition and halogen removal steps can be carried out rapidly. The use of a series of deposition-anneal steps provides for a more complete removal of halogen residues from the thick titanium nitride film while permitting a rapid film deposition rate. Preferably, the residual halogen content in the TiN film produced by the method of the invention is less than about 1.5 atomic percent, and the film is free from blisters and cracks.

DETAILED DESCRIPTION OF THE INVENTION

The present invention relates to method for depositing thick titanium nitride films (having a film thickness greater than about 400 Å), where the resistivity of the deposited film is less than about 175 $\mu\Omega$cm, and the residual halogen content is less than 1.5 atomic percent. In a particularly useful instance, the method can be used to produce a substantially uniform TiN film of a thickness of 1000 Å or higher, where the film deposition rate is at least 400 Å/min and the resistivity of the deposited film is less than about 175 $\mu\Omega$cm.

As a preface to the detailed description, it should be noted that, as used in this specification and the appended claims, the singular forms "a", "an", and "the" include plural referents, unless the context clearly dictates otherwise.

I. APPARATUS USED TO CARRY OUT THE INVENTION

Any conventional apparatus may be used to carry out the present invention. The apparatus which was used by applicants in development of the method of the invention was a TxZ-I™ processing system available from Applied Materials, Inc. of Santa Clara, Calif. The TxZ-I™ processing system is available on both a Centura® and Optima® platform and is designed for single-wafer processing. A typical process chamber is shown in FIG. 4.

Figure 4:
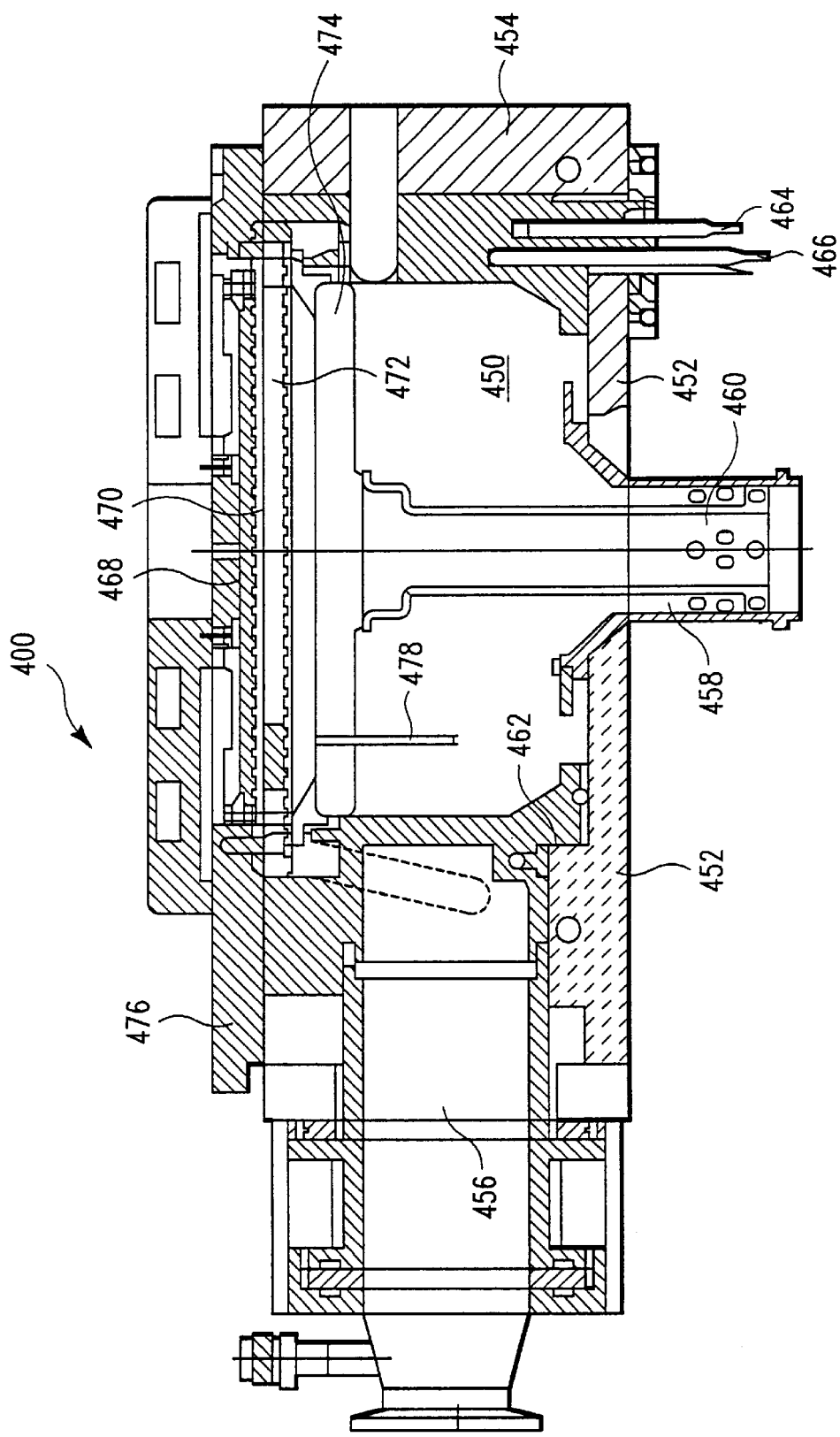
FIG. 4 is a schematic representation of a prior art CVD chamber of the kind which can be used to practice the present invention.

With reference to FIG. 4, process chamber 400 includes an interior chamber 450 which is essentially bucket shaped, having a cylindrical sidewall 454 and a base 452. Interior to sidewall 454 is a heated liner 462. There is an opening 456 in one portion of sidewall 454, which is connected to an exhaust assembly (not shown) for the removal of process and product gases. The chamber base 452 has a centrally-located opening 458, which is provided to accommodate a pedestal assembly 460 which is attached to substrate support pedestal 474, which typically supports a semiconductor wafer for processing. Substrate lift pins 478 operate to lower and raise a substrate (not shown) to the upper surface of support pedestal 474. A resistive heater 464 is used to maintain heated liner 462 at a desired temperature. Power to resistive heater 464 is controlled based on information provided from thermocouple 466 embedded in heated liner 462. Process gases enter process chamber 400 through a gas distribution manifold 476, which is connected to a dual-gas showerhead assembly 468 and pass through a faceplate 470 to reach processing area 472. The showerhead assembly 468 provides a dual-gas separate entry for TiCl$_4$ and NH$_3$ into the processing area 472 without premixing of the gases. The gas distribution manifold assembly 476 also serves as the lid of process chamber 400. To avoid the formation of undesirable deposits inside the showerhead assembly 468, separate flow paths or passageways are established through different channels (not shown) in showerhead assembly 468.

Figure 5:
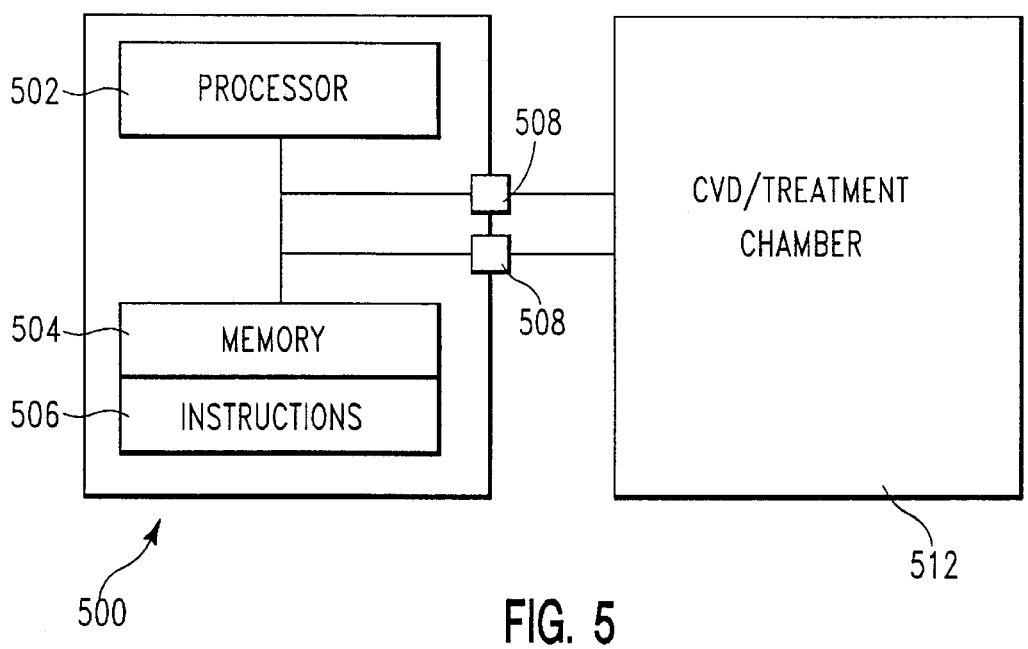
FIG. 5 is a schematic representation of an apparatus for practicing the present invention which includes elements for computerized control of the apparatus used to carry out the method of the invention.

Preferably, the apparatus used to practice the present invention is adapted to be controlled by a computer. FIG. 5 shows a computer 500. Computer 500 comprises a processor 502, memory 504 adapted to store instructions 506, and one or more ports 508. Processor 502 is adapted to communicate with memory 504 and to execute instructions 506. Processor 502 and memory 504 are also adapted to communicate with one or more ports 508. Ports 508 are adapted to communicate with a CVD/Treatment chamber 512. Chamber 512 is adapted to carry out process steps in accordance with signals received from processor 502 via ports 508. Preferably, computer 502 can control the composition and feed rate of the CVD process gases, the composition and feed rate of the residual halogen removal treatment gases, the process temperature, the pressure in the chamber, the time period for each process step, and other similar functions. Preferably, computer 502 is adapted to receive measurements that describe the condition in the chamber, and adapt the process variables accordingly. This programmed control of process variables enables production of a predetermined device etch profile as required for a given use application.

II. METHOD OF THE INVENTION

In a typical chemical vapor deposition process, titanium nitride film is deposited by introducing titanium tetrahalide (typically, titanium tetrachloride), and ammonia into a reaction chamber. The gases react to form titanium nitride according to the following general reaction:

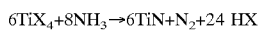

$$6TiX_4 + 8NH_3 \rightarrow 6TiN + N_2 + 24\ HX$$

Wherein X is a halogen atom.

Typically, the halogen atom is chlorine, but the present invention is not intended to be limited to the use of a chlorine-comprising halogen precursor. In practice, however, the reaction does not yield 100 % product, and depending on the processing conditions, some halogen atoms are often trapped within the resulting TiN film.

The residual halogen atoms cause several problems. For example, the presence of residual chlorine in the TiN film increases the risk of corroding adjacent conductive layers, as the chlorine migrates into these layer. In addition, the residual chlorine atoms generally increase the film's resistivity. In addition, Applicants discovered if a very thick film (1,000 Å or greater) is annealed in the presence of NH$_3$, the residual halogen atoms will cause the film to form micro cracks. However, applicants discovered that annealing can be carried out without causing such cracks to form if the thickness of the film being annealed does not exceed 400 Å.

Figure 1:
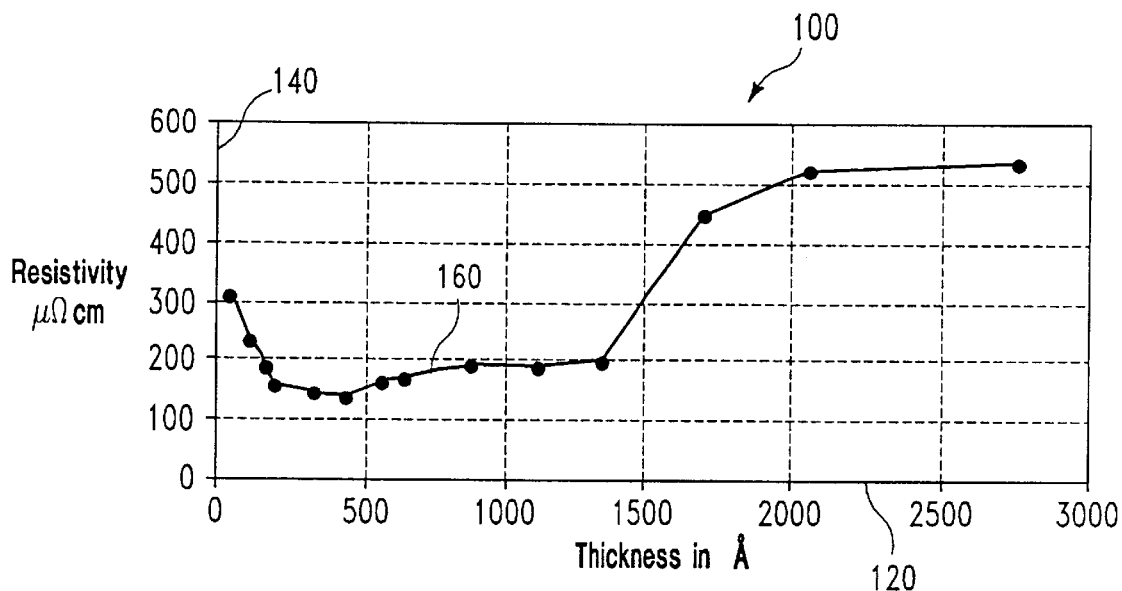
FIG. 1 graphically illustrates the relationship between film thickness and resistivity in a TiN film of made according to the prior art, using a continuous deposition process. This figure shows that resistivity increases to about 520 $\mu\Omega$cm as the film thickness approaches 2800 Å.

Referring to FIG. 1, graph 100 illustrates the prior art relationship between the resistivity (measured in $\mu\Omega$cm), shown on the graph 100 ordinate 140, and the film thickness of a TiN film (measured in Å), shown on graph 100 abscissa 120. Curve 160 illustrates that for a TiN film made using a continuous deposition process, the resistivity of a film tends to decrease with film thickness up to about 400 Å. As film thickness continues to increase, resistivity begins to increase, making a substantial increase at film thicknesses over about 1,350 Å.

Figure 2:
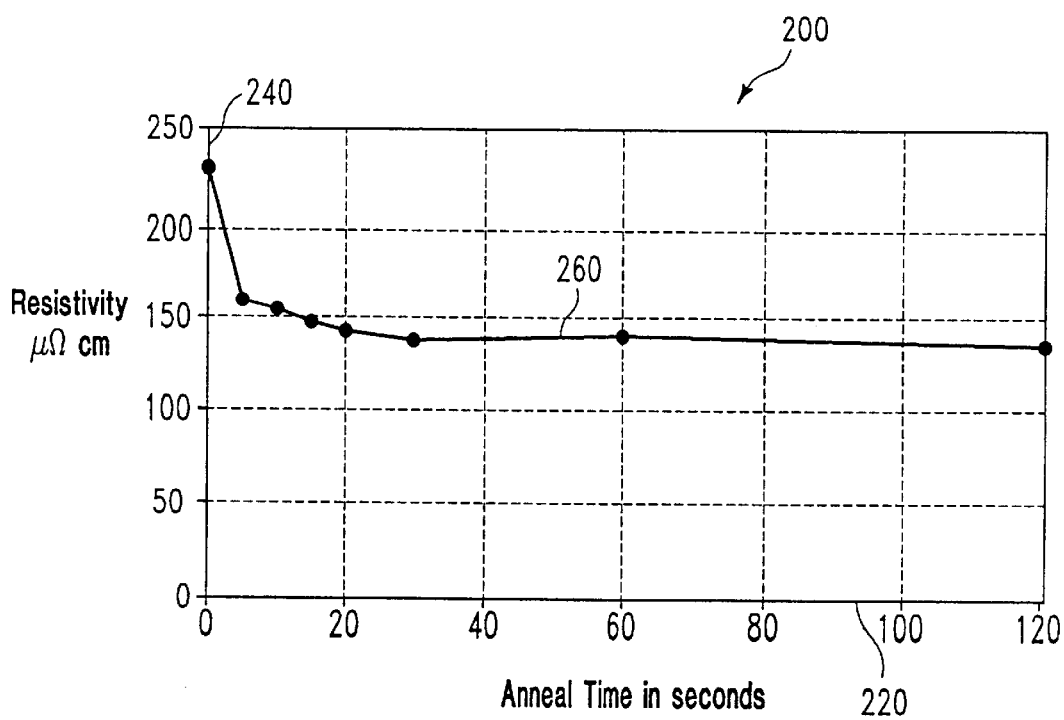
FIG. 2 graphically illustrates the relationship between the resistivity and annealing time for a typical prior art TiN film deposited in a single deposition step and having a thickness of 200 Å. No change in film thickness was observed during annealing.

Applicants determined that when a TiN film approximately 200 Å thick is annealed in the presence of NH$_3$, an annealing time of about 5 seconds produces a drastic decrease in film resistivity, which continues to decrease for treatment times out to about 40 seconds. Longer annealing in the presence of $NH_3$ may be used, but are not necessary. FIG. 2 shows graph 200, which illustrates the effect on film resistivity of annealing a 200 Å thick TiN film, when the film is annealed at approximately 680° C., in the presence of $NH_3$, at a pressure of about 10 Torr. The resistivity is shown on the ordinate 240 in $\mu\Omega cm$, and the annealing time in seconds is shown on the abscissa 220. Curve 260 illustrates that for a TiN film annealed in the presence of $NH_3$ at the conditions specified above, the resistivity of a film tends to decrease with annealing time up to about 20–30 seconds, then remain substantially constant up to at least 120 seconds annealing time. In practical terms, a treatment time of about 20 seconds may be used to achieve excellent results.

Figure 3:
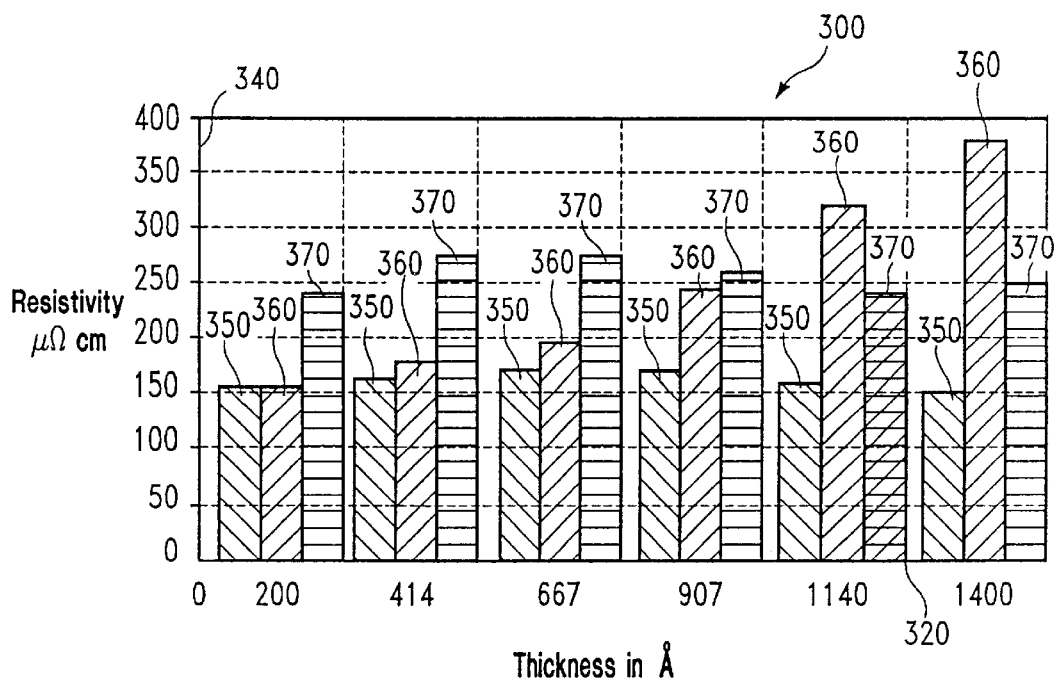
FIG. 3 is a bar graph which depicts a comparison of the relationship between resistivity and film thickness for films deposited by different methods. The total film thickness is shown on scale 320. The resistivity is shown on scale 340. The bar labeled 350 represents a film deposited in multiple steps (with the exception of the 200 Å thickness), where multiple layers averaging approximately 245 Å were deposited to reach the total film thickness indicated. After each layer deposition, the film (with substrate) was annealed in the presence of an ammonia-comprising ambient. The bar labeled 360 represents a film deposited in a single deposition, where the film was annealed in the presence of an ammonia-comprising ambient. The bar labeled 370 represents a film deposited in a single deposition which was not annealed.

As previously mentioned, the presence of residual halogen atoms in the TiN film increases the film's resistivity. FIG. 3 provides comparative data which illustrates the advantages of Applicants' invention. Bar Graph 300, shows comparative data for TiN films deposited using three different methods. The TiN film thickness in Å is shown on scale 320, while the film resistivity in $\mu\Omega cm$ is shown on scale 340.

Films of various thicknesses which were CVD deposited using the prior art continuous deposition method and not annealed are represented by bars labeled 370.

Films of various thicknesses which were CVD deposited using the prior art continuous deposition method and annealed in the presence of $NH_3$ after completion of deposition are represented by bars labeled 360. The annealing was carried out at about 680° C. in the presence of $NH_3$, at a pressure of about 10 Torr.

Films of various thicknesses deposited using the method of the present invention are represented on Bar Graph 300 by bars labeled 350. These films were CVD deposited in a series of deposition/anneal steps, where each step included CVD deposition of a layer of TiN, followed by annealing in the presence of $NH_3$. The average thickness of an individual film layer CVD deposition was about 240 Å. (The technique used to CVD deposit all of the films is shown on Bar Graph 300 is described in the Example below.) After each CVD deposition of an individual film layer, the TiN film (which increased in thickness after deposition of each layer) was annealed in the presence of $NH_3$ at about 680° C., at a pressure of 10 Torr for about 20 seconds. A longer annealing time may be used if desired, but is not necessary in view of the data presented in FIG. 2. The number of steps performed depended on the final thickness of the film produced.

As can be seen in Bar Graph 300, the resistivity of a 1,400 Å thick film produced by the method of the invention (as shown by bars labeled 350) is only about 150 $\mu\Omega cm$, which is essentially the same as the resistivity of a 200 Å thick film annealed in the presence of $NH_3$. This contrasts with the prior art methods in which the TiN film is deposited in one continuous layer. In the case where the TiN film was CVD deposited in a single, continuous deposition and annealed in the presence of $NH_3$ after completion of deposition (as shown by bars labeled 360), the resisitivity of a 1,400 Å thick film increased to about 375 $\mu\Omega cm$, compared with 150 $\mu\Omega cm$ for a 200 Å thick film. This also contrasts with the TiN film deposited in one continuous layer and not annealed (as shown by bars labeled 370), where the resistivity of a 1,400 Å thick film is about 250 $\mu\Omega cm$, compared with about 240 $\mu\Omega cm$ for a 200 Å thick film.

By using the method of the present invention, applicants were able to produce TiN films having a thickness of 1,400 Å with a resistivity of only 150 $\mu\Omega cm$, where films of this same thickness produced by methods previously known in the art resulted in a 1,400 Å thick film having a resistivity ranging from about 250 $\mu\Omega cm$ to about 375 $\mu\Omega cm$.

The merits of the invention will be more clear in reference to the following non-limiting Example.

EXAMPLE

One embodiment of Applicants' invention was implemented as follows. A silicon wafer was prepared having on its surface a transition layer of titanium silicide (TiSi) having a thickness of about 150 Å. The presence of a TiSi layer between a silicon substrate and an overlaying film of TiN has the advantages of reducing contact resistance. It will be understood by those having ordinary skill in the art that variations of this invention, such as applying the TiN film over a different substrate or over a silicon wafer having other intermediary layers between the substrate and the TiN film are within the scope of this invention.

1. Deposition Step

With reference to FIG. 4, the substrate described above was placed in the TxZ-I™ C.VD chamber previously described. The TiN layer may be CVD deposited on a substrate heated to a temperature ranging from about 550° C. to a temperature of about 720° C. For the embodiment films described herein, the TiN layers were CVD deposited at about 680° C. The process chamber was heated to about 680° C. over a time period of about 20 seconds. Thereafter, titanium tetrachloride (which is vaporized prior to entering the process chamber) and process gases including ammonia, nitrogen, helium and argon, were introduced into the process chamber typically the amount of titanium tetrachloride ($TiCl_4$) entering the process chamber ranges from about 50 mg/min. to about 400 mg/min. The typical flow rate ranges for the process gases are: ammonia ($NH_3$) from about 50 sccm to about 200 sccm; nitrogen ($N_2$) from about 500 sccm to about 2,000 sccm; helium (He) from about 500 sccm to about 2,000 sccm; and argon (Ar) from about 500 sccm to about 2,000 sccm. The process chamber pressure typically ranges between about 5 Torr and about 30 Torr. For the TiN films described herein, the feed rate for $TiCl_4$ was 200 mg/min. and the process gas flow rates were 100 sccm $NH_3$, 1,000 sccm $N_2$, 1,000 sccm He, and 1,000 sccm Ar. The CVD process chamber pressure was 10 Torr throughout each film deposition step. The combination of gases, including vaporized $TiCl_4$, was fed into chamber 400 through gas distribution manifold 476, and was mixed through a face plate (not shown) on showerhead 468. The pressure in the process chamber was maintained at 10 Torr, with excess product and process gas being exhausted through opening 456 in the chamber wall, leading to an exhaust assembly (not shown).

To produce a film thickness of about 200 Å, the flow of $TiCl_4$ was stopped after about 20 seconds. Thicker films required a proportional increase in $TiCl_4$ feed time. After the deposition step was completed, the films were treated for chlorine removal (with the exception of films shown in Bar Graph 300 as bars 370, which were not annealed or treated for chlorine removal).

2. Treatment for Residual Chlorine Removal

After the deposition step was competed, and the flow of $TiCl_4$ into the chamber was stopped, the residual chlorine removal treatment was carried out as follows: The substrate, including the TiN film, was maintained at a temperature of about 680° C., and the following process gases were fed to the process chamber to produce the ambient for chlorine removal from the deposited film. the typical flow rate ranges for the chlorine treatment process gases are: ammonia ($NH_3$) from about 100 sccm to about 3,000 sccm; nitrogen ($N_2$) from about 500 sccm to about 2,000 sccm; helium (He) from about 500 sccm to about 2,000 sccm; and argon (Ar) from about 500 sccm to about 2,000 sccm. For the chlorine removal treatment of the TiN films described herein, the feed rate for $NH_3$ was 500 sccm, $N_2$ was 1,000 sccm, He was 1,000 sccm, and Ar was 1,000 sccm. The chlorine removal treatment gases were fed into the CVD process chamber through the same inlet system previously mentioned, with chamber pressure being maintained at a pressure ranging from about 5 Torr to about 30 Torr in the manner previously described. Preferably the chamber pressure was about the same as the pressure used during CVD of the TiN film. The residual chlorine removal treatment step was carried on for a time period ranging from about 5 to about 40 seconds, preferably for about 20 seconds. The number of residual chlorine treatments depended on the number of TiN layer CVD depositions. The films shown in bars labeled 360 on Bar Graph 300 deposited in one continuous deposition were treated only once, at the end of the deposition. The films shown in bars labeled 350 were deposited using multiple deposition/anneal steps, wherein the average individual film layer CVD deposition thickness was about 240 Å, with a chlorine removal treatment step occurring after each CVD deposition.

The above described preferred embodiments are not intended to limit the scope of the present invention, as one skilled in the art can, in view of the present disclosure, expand such embodiments to correspond with the subject matter of the invention claimed below.

We Claim:

1. A method of producing a low residual halogen content TiN layer using chemical vapor deposition, wherein the TiN layer thickness is greater than 400 Å, comprising the steps of:
   (a) forming a layer of TiN having a thickness of less than about 400 Å by chemical vapor deposition using a halogen-comprising precursor and a nitrogen-comprising precursor, wherein said TiN layer is deposited at a rate of at least 400 Å per minute on a substrate at a process chamber pressure within the range of about 5 Torr to about 30 Torr;
   (b) treating said layer of TiN with at least one gas which reacts with said halogen at a pressure ranging from about 5 Torr to about 30 Torr, to produce a reaction product which is volatile under process conditions used for said treatment; and
   (c) repeating steps (a) and (b) to form a combined TiN layer having an overall thickness greater than about 400 Å.

2. The method of claim 1, wherein said overall thickness of said combined TiN layer is greater than about 1,000 Å.

3. The method of claim 1 or claim 2, wherein said nitrogen-comprising precursor also contains hydrogen.

4. The method of claim 3, wherein said nitrogen-comprising precursor is ammonia.

5. The method of claim 1 or claim 2, wherein said TiN layer is formed on a silicon substrate.

6. The method of claim 1 or claim 2, wherein said TiN layer is formed over a layer of TiSi.

7. The method of claim 1 or claim 2, wherein said TiN layer has a resistivity of less than about 200 $\mu\Omega$cm.

8. The method of claim 7, wherein said resistivity is less than about 175 $\mu\Omega$cm.

9. The method of claim 1 or claim 2, wherein the halogen content of said combined TiN layer is less than about 1.5 atomic percent.

10. The method of claim 9, wherein said halogen is chlorine.

11. The method of claim 1 or claim 2, wherein each TiN layer is formed to have a thickness within the range of about 200 Å to less than about 400 Å.

12. The method of claim 1 or claim 2, wherein a source gas for said chemical vapor deposition of said TiN layer further comprises a gas selected from the group consisting of nitrogen, helium, argon, and combinations thereof.

13. The method of claim 1 or claim 2, wherein said TiN layer is treated with a gas comprising $NH_3$ and a gas selected from the group consisting of nitrogen, helium, argon, and combinations thereof.

14. The method of claim 1 or claim 2, wherein said TiN layer is treated with a gas comprising $NH_3$ for a time period ranging from about 5 seconds to about 40 seconds.

15. The method of claim 1 or claim 2, wherein said halogen is chlorine.

16. The method of claim 15, wherein said nitrogen-comprising precursor also contains hydrogen.

17. The method of claim 16, wherein said nitrogen-comprising precursor is ammonia.

18. The method of claim 15, wherein said TiN layer is deposited on a substrate heated to a temperature ranging from about 550° C. to about 720° C.

19. The method of claim 15, wherein said chlorine-comprising precursor is $TiCl_4$.

20. The method of claim 19, wherein said nitrogen-comprising precursor is ammonia.

21. The method of claim 15, wherein said TiN layer has a resistivity of less than about 200 $\mu\Omega$cm.

22. The method of claim 21, wherein said resistivity is less than about 175 $\mu\Omega$cm.

23. A method of producing a low residual halogen content TiN layer using chemical vapor deposition, wherein the TIN layer thickness is greater than 400 Å, comprising the steps of:
   (a) forming a layer of TIN having a thickness of less than about 400 Å by chemical vapor deposition using a halogen-comprising precursor and a nitrogen-comprising precursor, wherein said TIN layer is deposited at a rate of at least 400 Å per minute on a substrate at a process chamber pressure within the range of about 5 Torr to about 30 Torr;
   (b) treating said layer of TiN with a gas comprising $NH_3$ at a process chamber pressure within the range of about 5 Torr to about 30 Torr; and
   (c) repeating steps (a) and (b) to form a combined TiN layer having an overall thickness greater than about 400 Å.

24. A method of producing a low residual halogen content TiN layer using chemical vapor deposition, wherein the TiN layer thickness is greater than 400 Å, comprising the steps of:
   (a) forming a layer of TiN having a thickness of less than about 400 Å by chemical vapor deposition using a gas comprising $TiCl_4$ and $NH_3$, wherein said TiN layer is deposited on a substrate at a process chamber pressure within the range of about 5 Torr to about 30 Torr;
   (b) treating said layer of TiN with a gas comprising $NH_3$ at a process chamber pressure within the range of about 5 Torr to about 30 Torr; and
   (c) repeating steps (a) and (b) to form a combined TiN layer having an overall thickness greater than about 400 Å.

25. The method of claim 24, wherein said TiN layer is deposited on said substrate at a rate of at least 400 Å per minute.

26. The method of claim 24, wherein said TiN layer is deposited at a substrate temperature ranging from about 550° C. to about 720° C.

* * * * *